(12) United States Patent
Jung et al.

(10) Patent No.: US 12,673,339 B2
(45) Date of Patent: Jul. 7, 2026

(54) SUBSTRATE PROCESSING APPARATUS

(71) Applicant: SEMES CO., LTD.,
Chungcheongnam-do (KR)

(72) Inventors: Bu Young Jung, Chungcheongnam-do
(KR); Ju Hwan Lee,
Chungcheongnam-do (KR); **Hyun Woo
Bae**, Chungcheongnam-do (KR)

(73) Assignee: SEMES CO., LTD.,
Chungcheongnam-Do (KR)

( * ) Notice: Subject to any disclaimer, the term of this
patent is extended or adjusted under 35
U.S.C. 154(b) by 548 days.

(21) Appl. No.: 18/187,098

(22) Filed: Mar. 21, 2023

(65) Prior Publication Data

US 2024/0149289 A1     May 9, 2024

(30) Foreign Application Priority Data

Nov. 8, 2022     (KR) ........................ 10-2022-0147522

(51) Int. Cl.
| | |
|---|---|
| *B05B 13/02* | (2006.01) |
| *B05B 14/10* | (2018.01) |
| *B05B 14/30* | (2018.01) |
| *B05C 9/06* | (2006.01) |
| *B05B 7/16* | (2006.01) |
| *B05B 14/40* | (2018.01) |
| *B05B 15/58* | (2018.01) |
| *B05B 15/658* | (2018.01) |
| *B05B 16/60* | (2018.01) |
| *B05D 1/34* | (2006.01) |
| *H10P 72/00* | (2026.01) |

(52) U.S. Cl.
CPC .......... *B05B 13/0278* (2013.01); *B05B 14/10*
(2018.02); *B05B 14/30* (2018.02); *B05C 9/06*
(2013.01); *B05B 7/16* (2013.01); *B05B 7/1693*
(2013.01); *B05B 14/40* (2018.02); *B05B 15/58*
(2018.02); *B05B 15/658* (2018.02); *B05B
16/60* (2018.02); *B05D 1/34* (2013.01); *H10P
72/0414* (2026.01)

(58) Field of Classification Search
CPC ... B05B 7/1693; B05B 13/0278; B05B 14/30;
B05B 15/658; B05B 15/58; B05B 7/16;
B05B 14/10; B05B 16/60; B05B 14/40;
H01L 21/67051; B05C 9/06; B05D 1/34
See application file for complete search history.

(56) References Cited

U.S. PATENT DOCUMENTS

2014/0231010 A1     8/2014    Park et al.

FOREIGN PATENT DOCUMENTS

| | | | |
|---|---|---|---|
| JP | H8-100717 A | | 4/1996 |
| JP | 2003203897 A | * | 7/2003 |
| KR | 10-2014-0103650 A | | 8/2014 |
| KR | 10-2018-0070220 A | | 6/2018 |
| KR | 10-2050809 B1 | | 12/2019 |

(Continued)

*Primary Examiner* — Benjamin L Osterhout
(74) *Attorney, Agent, or Firm* — Carter, DeLuca & Farrell
LLP

(57)     ABSTRACT

A substrate processing apparatus includes a first supply pipe
supplying a first chemical liquid to a substrate, a second
supply pipe, spaced apart from the first supply pipe, and
supplying a second chemical liquid to the substrate, and a
recovery pipe connected to the first supply pipe to collect the
first chemical liquid, and disposed between the first supply
pipe and the second supply pipe.

14 Claims, 9 Drawing Sheets

(56) References Cited

FOREIGN PATENT DOCUMENTS

TW        201218298 A  *  5/2012  ........... H01L 18/168
TW        201245489 A  * 11/2012  ........... C23C 18/168
TW        201245490 A  * 11/2012  ......... C23C 18/1619

* cited by examiner

1000

400

410

411

430

420

1

SUBSTRATE PROCESSING APPARATUS

CROSS-REFERENCE TO RELATED APPLICATION(S)

This application claims benefit of priority to Korean Patent Application No. 10-2022-0147522 filed on Nov. 8, 2022 in the Korean Intellectual Property Office, the disclosure of which is incorporated herein by reference in its entirety.

BACKGROUND

1. Field

The present disclosure relates to a substrate processing apparatus for processing a substrate.

2. Description of Related Art

In order to manufacture a semiconductor device or a liquid crystal display, various processes such as photolithography, etching, ashing, ion implantation, and thin film deposition are performed on a substrate. Before or after such a process is performed, a cleaning process for cleaning the substrate is performed to remove contaminants and particles generated in each process.

In general, a cleaning process is a process of supplying a chemical liquid to a substrate to remove contaminants and particles attached to the substrate. In this cleaning process, chemical liquid is provided to the process chamber from the liquid storage tank, and a chemical liquid is supplied to a substrate located in a process chamber, thereby performing the cleaning process. In order to supply the chemical liquid to the process chamber, the process chamber and the liquid storage tank are connected by a liquid supply pipe. The chemical liquid stored in the liquid storage tank is supplied to the process chamber through the liquid supply pipe.

In addition, a plurality of liquid supply pipes may be provided to supply different chemical liquids. In addition, the chemical liquid having a large temperature difference according to the type of the chemical liquid may be supplied through a plurality of liquid supply pipes within one facility. Accordingly, the temperature of the chemical liquid supplied through the liquid supply pipe affects the chemical liquid supplied through other adjacent liquid supply pipes, and accordingly, there is a problem in which process defects occur because the etching rate is affected in the cleaning process.

SUMMARY

An aspect of the present disclosure is to provide a substrate processing apparatus preventing a liquid supply pipe supplying a chemical liquid to a substrate from being thermally affected by other liquid supply pipes having a temperature different therefrom.

According to an aspect of the present disclosure, a substrate processing apparatus includes a first supply pipe supplying a first chemical liquid to a substrate; a second supply pipe, spaced apart from the first supply pipe, and supplying a second chemical liquid to the substrate; and a recovery pipe connected to the first supply pipe to collect the first chemical liquid, and disposed between the first supply pipe and the second supply pipe.

The recovery pipe may have a structure surrounding the first supply pipe.

As a first embodiment, the recovery pipe may be disposed to be spaced apart from the first supply pipe such that an air insulation layer having an air pocket structure is formed between the recovery pipe and the first supply pipe.

As a second embodiment, the recovery pipe may have a structure in which the interior thereof is penetrated by the first supply pipe. Both ends of the recovery pipe through which the first supply pipe passes may be heat-sealed to the first supply pipe.

As a third embodiment, the recovery pipe may spirally wrap the first supply pipe. Inclined portions of the recovery pipe adjacent to each other may be formed to be in close contact with each other. The recovery pipe may be spaced apart from the first supply pipe such that an air pocket-structured air insulation layer is formed between the spiral structure of the recovery pipe and the first supply pipe.

As a fourth embodiment, the first supply pipe, the second supply pipe, and the recovery pipe may be disposed outside the process chamber.

According to an aspect of the present disclosure, a substrate processing apparatus includes a nozzle unit including a nozzle arm, a main nozzle head, and a side nozzle head; a first supply pipe installed on the nozzle arm of the nozzle unit and supplying a first chemical liquid to the main nozzle head; a second supply pipe installed on the nozzle arm, spaced apart from the first supply pipe, and supplying a second chemical liquid to the side nozzle head; and a recovery pipe installed on the nozzle arm, connected to the first supply pipe to collect the first chemical liquid, and disposed between the first supply pipe and the second supply pipe.

The main nozzle head may be installed on an end of the nozzle arm, and the first supply pipe and the recovery pipe may extend from an inside the nozzle arm and may be connected to the main nozzle head, the side nozzle head may be installed on an end of an extension support extending from a side of the nozzle arm, and the second supply pipe may extend from an inside of the nozzle arm to an outside of the nozzle arm and may be connected to the side nozzle head, and the recovery pipe may have a structure surrounding the first supply pipe inside the nozzle arm.

According to an aspect of the present disclosure, a substrate processing apparatus includes a process chamber; a processing container installed in the process chamber and having a processing space in which a substrate is processed; a support unit supporting the substrate in the processing space; a nozzle unit including a main nozzle head and a side nozzle head discharging a chemical liquid to the substrate, and a nozzle arm on which the main nozzle head and the side nozzle head are installed; and a liquid supply line extending from a liquid supply unit to an inside of the nozzle unit. The liquid supply line includes a first supply pipe installed on the nozzle arm and supplying a first chemical liquid to the main nozzle head, a second supply pipe installed on the nozzle arm, spaced apart from the first supply pipe, and supplying a second chemical liquid to the side nozzle head, and a recovery pipe installed on the nozzle arm, connected to the first supply pipe to collect the first chemical liquid, and disposed between the first supply pipe and the second supply pipe.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
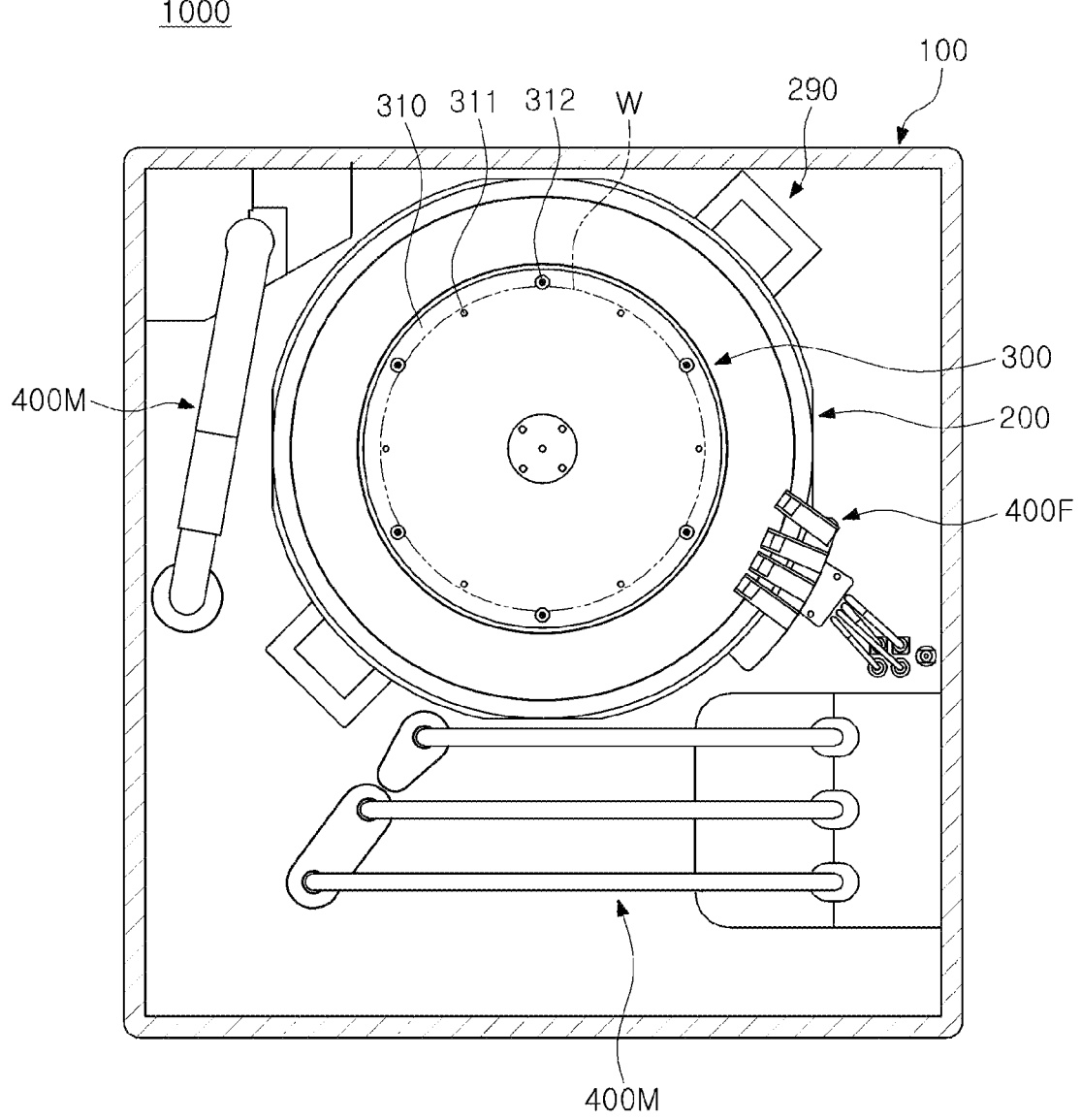
FIG. 1 is a plan view illustrating a substrate processing apparatus to which the present disclosure is applied.

Hereinafter, embodiments will be described in detail such that those skilled in the art may easily practice the present disclosure with reference to the accompanying drawings. However, in describing a preferred embodiment in detail, if it is determined that a detailed description of a related known function or configuration may unnecessarily obscure the gist of the present disclosure, the detailed description will be omitted. In addition, the same reference numerals are used throughout the drawings for parts having similar functions and actions. In addition, in the present specification, terms such as 'on,' 'upper portion,' 'upper surface,' 'below,' 'lower portion,' 'lower surface,' 'side' and the like are based on the drawings, and may be changed depending on the direction in which components are actually disposed.

In addition, throughout the specification, when a part is said to be 'connected' to another part, it is not only 'directly connected,' but also 'indirectly connected' with other components therebetween. Further, 'including' a certain component means that other components may be further included, rather than excluding other components unless otherwise stated.

Figure 2:
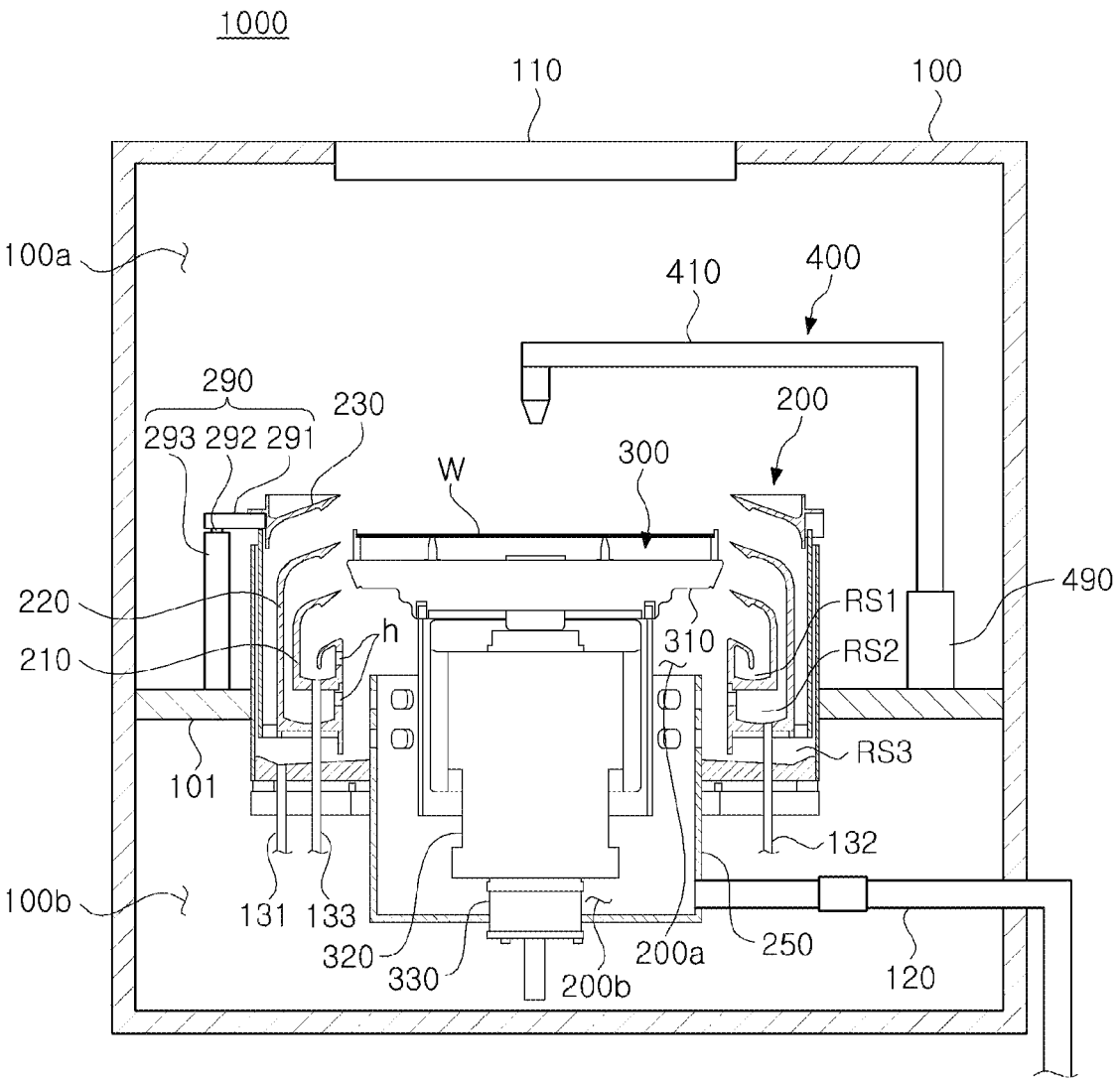
FIG. 2 is a view illustrating the interior of the substrate processing apparatus of FIG. 1.

FIG. 1 is a plan view illustrating a substrate processing apparatus to which the present disclosure is applied, and FIG. 2 is a view illustrating the interior of the substrate processing apparatus of FIG. 1.

Referring to the drawings, a substrate processing apparatus 1000 according to an embodiment includes a process chamber 100 for performing a process on a substrate W with a liquid. In the process chamber 100, a process is performed on the substrate (W) while the substrate (W) is held horizontally. The process may be a process of etching a nitride film formed on the substrate (W). In this case, the liquid may include phosphoric acid. Furthermore, the process chamber 100 may be used in a process of removing foreign substances and film quality remaining on the surface of the substrate W using various liquids.

In detail, the process chamber 100 provides a sealed inner space, and a fan filter unit 110 is installed in an upper portion thereof. The fan filter unit 110 generates vertical airflow inside the process chamber 100. The fan filter unit 110 is a modularized unit of a filter and an air supply fan, and filters clean air and supplies the same to the interior of the process chamber 100. After passing through the fan filter unit 110, the clean air is supplied into the process chamber 100 to form a vertical airflow. This vertical airflow provides a uniform airflow over the substrate (W), and the contaminants (fume) generated in the process of processing the surface of the substrate (W) by the processing fluid are discharged together with air to discharge lines 131, 132 and 133 through suction ducts 210, 220, and 230 of a processing container 200 and removed, thereby maintaining a high degree of cleanliness inside the processing container.

The process chamber 100 includes a process area 100a and a maintenance area 100b partitioned by a horizontal partition wall 101. A driving member 293 of a lifting unit 290 and a driving member 490 of a nozzle unit 400 are installed on the horizontal bulkhead 101. In addition, the maintenance area 100b is a space in which the discharge lines 131, 132, and 133 connected to the processing container 200 and an exhaust member 120 are located. This maintenance area 100b may be preferably isolated from the process area 100a in which the substrate W is processed.

The substrate processing apparatus 1000 according to an embodiment may include the processing container 200, a support unit 300, and the nozzle unit 400 in the process chamber 100. The processing container 200 is installed inside the process chamber 100, has a cylindrical shape with an open top, and provides a processing space for processing the substrate W. The open upper surface of the processing container 200 serves as a path through which the substrate W is taken out and carried in. In this case, the support unit 300 is positioned in the processing space. In this case, the support unit 300 supports the substrate (W) and rotates the substrate (W) during the process.

In addition, the processing container 200 provides an upper space 200a in which a spin head 310 of the support unit 300 is located, and a lower space 200b that is connected to an exhaust duct 250 in a lower portion thereof, such that forced exhaust is performed. The exhaust duct 250 is connected to the exhaust member 120 extending to the outside of the process chamber 100. In the upper space 200a of the processing container 200, annular first, second, and third suction ducts 210, 220, and 230 for inflowing and sucking chemical liquid and gas scattered on the rotating substrate W are disposed in multiple stages. The first, second and third suction ducts 210, 220 and 230 have exhaust ports h communicating with one common annular space (corresponding to the lower space of the processing container).

In this case, the first, second, and third suction ducts 210, 220, and 230 provide first to third recovery spaces RS1, RS2 and RS3 into which air currents containing scattered liquid and fumes are introduced from the substrate (W). The first recovery space RS1 is partitioned and formed by the first suction duct 210, and the second recovery space RS2 is formed as a separation space between the first suction duct 210 and the second suction duct 220. The third recovery space RS3 is formed as a separation space between the second suction duct 220 and the third suction duct 230.

In addition thereto, the processing container 200 is coupled to the lifting unit 290 changing the vertical position of the processing container 200. The lifting unit 290 moves the processing container 200 linearly in the vertical direction. As the processing container 200 moves up and down, the relative height of the processing container 200 with respect to the spin head 310 is changed. The lifting unit 290 has a bracket 291, a moving shaft 292, and a driving member 293. The bracket 291 is fixedly installed on the outer wall of the processing container 200, and the moving shaft 292 moving vertically by a driving member 293 is fixedly coupled to the bracket 291. When the substrate W is loaded into or unloaded from the spin head 310, the processing container 200 descends such that the spin head 310 protrudes upwardly from the processing container 200.

In addition, during the process, the height of the processing container 200 is adjusted such that the liquid may flow into the predetermined suction ducts 210, 220, and 230 according to the type of liquid supplied to the substrate W. Accordingly, the relative vertical position between the processing container 200 and the substrate W is changed. Accordingly, in the processing container 200, the type of liquid and pollutant gas recovered for each recovery space RS1, RS2, RS3 may be different.

The support unit 300 is installed inside the processing container 200. The support unit 300 supports the substrate W during the process and may be rotated by the driving member 330 during the process. In addition, the support unit 300 has the spin head 310 having a circular upper surface. The upper surface of the spin head 310 has a plurality of support pins 311 and a plurality of chucking pins 312 supporting the substrate (W). The plurality of support pins 311 are arranged at an upper edge of the spin head 310 at regular intervals and arranged in a predetermined arrangement, and protrude upward from the spin head 310. The support pins 311 support the lower surface of the substrate W such that the substrate W is supported while being spaced apart from the spin head 310 in an upward direction. The plurality of chucking pins 312 are disposed outside the support pins 311, and the chucking pins 312 protrude upward. The plurality of chucking pins 312 align the substrate W supported by the plurality of support pins 311 such that the substrate W is placed on the spin head 310 in a proper position. During the process, the plurality of chucking pins 312 come into contact with the side of the substrate (W) to prevent the substrate (W) from being separated from the original position thereof. A support shaft 320 supporting the spin head 310 is connected to the lower part of the spin head 310, and the support shaft 320 is rotated by a driving member 330 connected to the lower end thereof. In this case, the driving member 330 is provided as a motor or the like, and as the support shaft 320 rotates by the driving member 330, the spin head 310 and the substrate W rotate.

On the other hand, the nozzle unit 400 discharges liquid to the substrate W supported by the support unit 300. The nozzle unit 400 may be a moving nozzle device 400M or a fixed nozzle device 400F. In this case, the moving nozzle device 400M may be a plurality of moving nozzle devices 400M installed outside the processing container 200.

Figure 3:
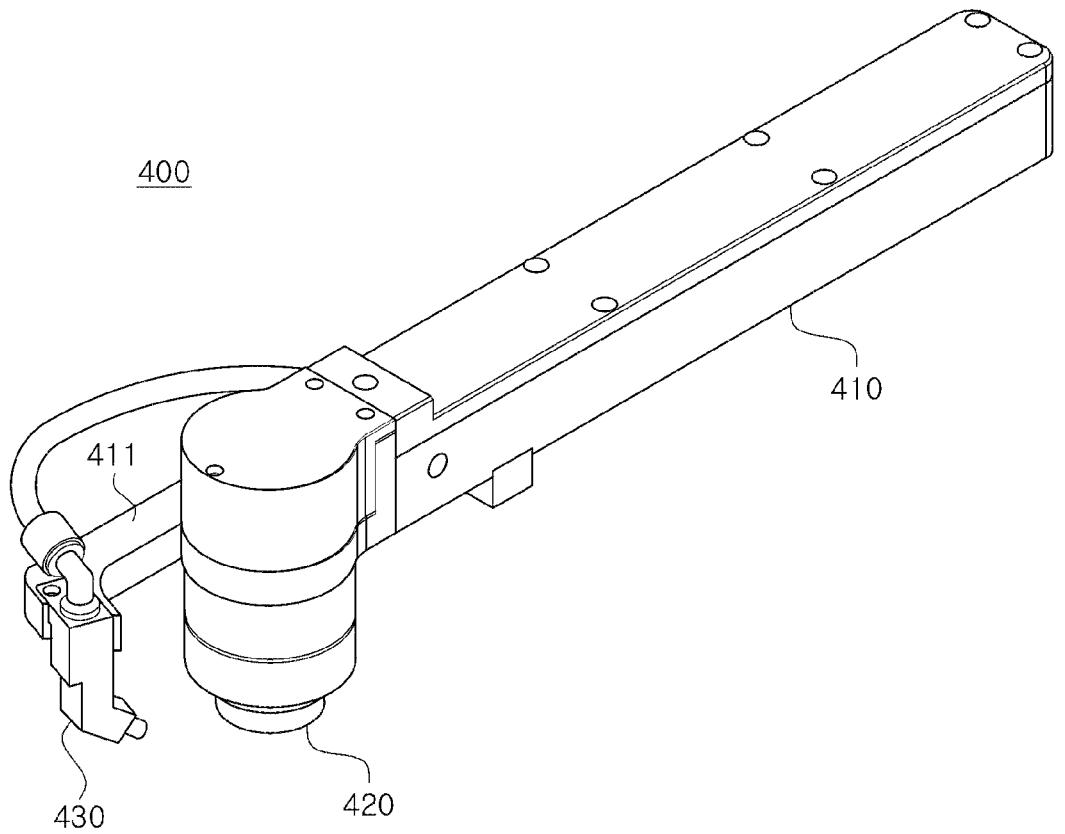
FIG. 3 is a perspective view illustrating a nozzle unit of the substrate processing apparatus of FIG. 2.
Figure 4:
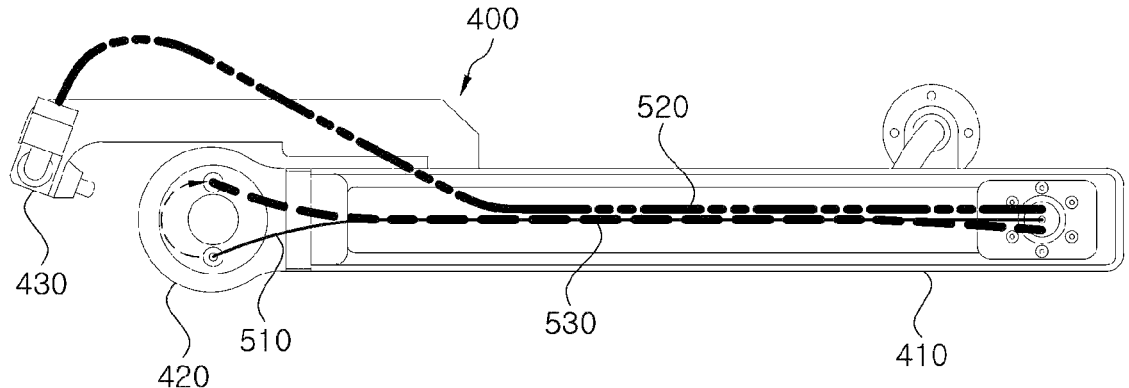
FIG. 4 is a view illustrating the interior of the nozzle unit of FIG. 3.

FIG. 3 is a perspective view illustrating the nozzle unit of the substrate processing apparatus of FIG. 2, and FIG. 4 is a view illustrating the interior of the nozzle unit of FIG. 3.

Referring to the drawing, the nozzle unit 400 includes a nozzle arm 410, a main nozzle head 420, and a side nozzle head 430. In this case, the main nozzle head 420 is installed on the end of the nozzle arm 410, an extension support 411 extending to one side is installed on the side of the nozzle arm 410, and the side nozzle head 430 is installed on the end of the extension support 411.

The nozzle arm 410 may have a configuration in which a first supply pipe 510 for supplying a first chemical liquid (510a in FIGS. 5 to 8) to the main nozzle head 420 and a recovery pipe 530 are installed such that the chemical liquid is circulated. For example, the first chemical liquid 510a may be recovered to a liquid supply unit (not illustrated, a liquid supply tank as an example) through the recovery pipe 530 and may be re-supplied from the liquid supply tank through the first supply pipe 510. The first chemical liquid

510a is supplied at a set appropriate temperature through the first supply pipe 510, and is circulated while being recovered through the recovery pipe 530 so that an appropriate temperature may be continuously maintained even when not discharged from the main nozzle head 420. For example, the first chemical liquid 510a may maintain an appropriate temperature set by the temperature maintaining device (heater or the like) of the liquid supply unit while circulating.

In addition, a second supply pipe 520 connected to the side nozzle head 430 and supplying a second chemical liquid (520a in FIGS. 5 to 8) may be installed in the nozzle arm 410.

Figure 5:
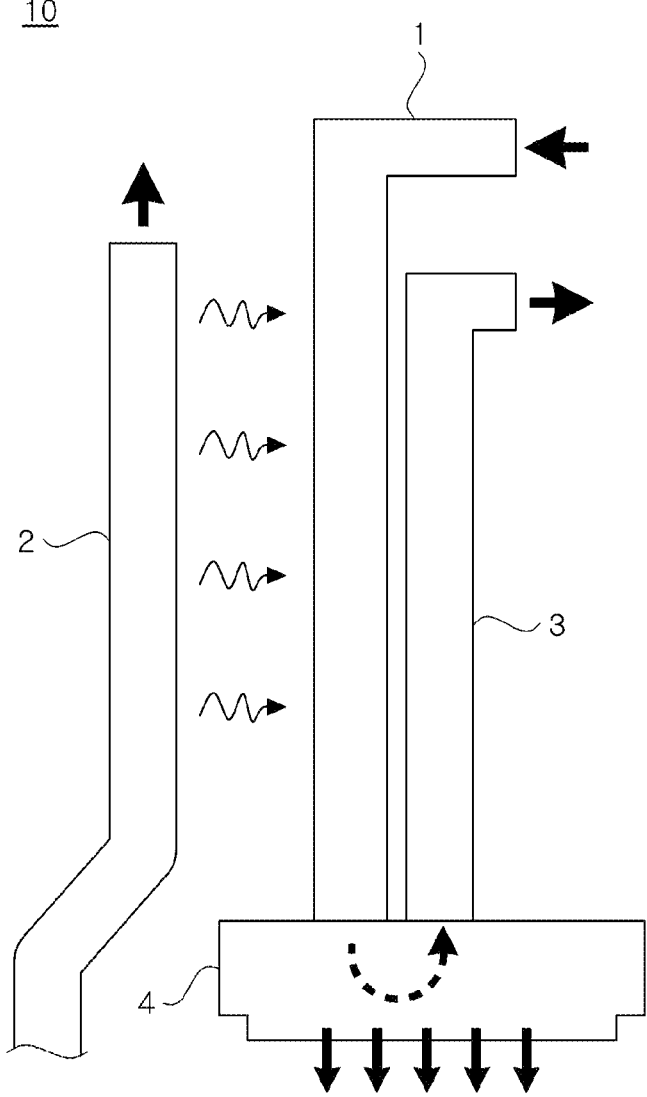
FIG. 5 is a view illustrating a substrate processing apparatus according to the related art.

FIG. 5 is a view illustrating a substrate processing apparatus according to the related art.

In the case of the substrate processing apparatus 10 of the related art, a high-temperature chemical liquid and a normal-temperature chemical liquid are mixed and used in a semiconductor facility. As an example, as illustrated in the drawing, a room-temperature chemical liquid may be supplied through the first supply pipe 1 and a high-temperature chemical liquid may be supplied through the second supply pipe 2. However, since the installation space inside the nozzle arm in which the first supply pipe 1 and the second supply pipe 2 are installed is narrow, the first supply pipe 1 and the second supply pipe 2 may be disposed adjacent to each other. At this time, as the high-temperature second supply pipe 2 transfers heat to the room temperature first supply pipe 1, the temperature of the chemical liquid inside the first supply pipe 1 is changed. Of course, the high-temperature second supply pipe 2 is generally wrapped with an insulating material (not illustrated) to reduce heat emitted to the outside, but when operated for a long time, the heat insulating material also rises to a high temperature and affects the first supply pipe 1 at room temperature, disposed adjacent thereto.

As described above, when pipes having different temperatures are disposed close to each other, the temperature of the chemical liquid inside the pipe is changed by heat transfer. Therefore, the temperature of the chemical liquid supplied to the substrate cannot be kept constant, and thus, the chemical discharge pressure at the nozzle head also changes, and thus there is a problem in that uniform cleaning is not obtained.

For reference, reference numeral 4 in FIG. 5 is the main nozzle head and is a part where the first supply pipe 1 and the recovery pipe 3 are connected.

FIGS. 6 to 9 are views illustrating a substrate processing apparatus according to an embodiment.

Referring to the drawings, a substrate processing apparatus 1000 according to an embodiment may include a first supply pipe 510 and a recovery pipe 530.

In this case, the first supply pipe 510 supplies the first chemical liquid 510a to the substrate, and the second supply pipe 520 is spaced apart from the first supply pipe 510 and supplies the second chemical liquid 520a to the substrate.

The recovery pipe 530 is connected to the first supply pipe 510 to recover the first chemical liquid 510a.

The first supply pipe 510, the second supply pipe 520, and the recovery pipe 530 may be installed in the nozzle arm 410 of the nozzle unit 400 as illustrated in FIG. 4 as an example. In this case, the first supply pipe 510 is connected to the main nozzle head 420 to supply the first chemical liquid 510a to the main nozzle head 420, and the second supply pipe 520 is connected to the side nozzle head 430. As a result, the second chemical liquid 520a may be supplied to the side nozzle head 430. In addition, the recovery pipe 530 may have a structure connected to the first supply pipe 510 in the main nozzle head 420.

The recovery pipe 530 is disposed between the first supply pipe 510 and the second supply pipe 520 spaced apart from the first supply pipe 510, and may enable the first chemical liquid 510a supplied from the first supply pipe 510 to be maintained at an appropriate supply temperature, along with the role of insulating the first supply pipe 510 from the second supply pipe 520.

In detail, the first supply pipe 510 and the second supply pipe 520 are configured to supply chemical liquids at different temperatures, for example, the chemical liquid of the second supply pipe 520 may be supplied at a temperature higher or lower than that of the chemical liquid of the first supply pipe 510. In detail, as an example, when the first chemical liquid 510a of the first supply pipe 510 has room temperature and the second chemical liquid 520a of the second supply pipe 520 has high temperature, the room-temperature first chemical liquid 510a recovered from the recovery pipe 530 may provide thermal insulation and cooling to the first chemical liquid 510a supplied from the first supply pipe 510. Alternatively, as another example, when the first chemical liquid 510a of the first supply pipe 510 is at high temperature and the second chemical liquid 520a of the second supply pipe 520 is at room temperature, the high-temperature first chemical liquid 510a recovered from the recovery pipe 530 may perform thermal insulation and heating with respect to the first chemical liquid 510a supplied from the first supply pipe 510.

Hereinafter, in the present disclosure, the case where the chemical liquid in the second supply pipe 520 is at high temperature and the chemical liquid in the second supply pipe 520 is at room temperature will be described as an example.

In detail, the recovery pipe 530 may have a structure surrounding the first supply pipe 510 inside the nozzle arm 410. For example, the recovery pipe 530 may be disposed around the first supply pipe 510. Thus, the recovery pipe 530 may block heat from the high-temperature second supply pipe 520 from being transferred to the room temperature first supply pipe 510.

Accordingly, in the present disclosure, in the process of recovering (returning) the first chemical liquid 510a through the recovery pipe 530, heat transfer from the second supply pipe 520 to the first supply pipe 510 may be naturally prevented even without an additional cooling device. If the first supply pipe 510 is cooled by an additional cooling device, a temperature control device should be added to the cooling device such that the first chemical liquid 510a of the first supply pipe 510 reaches a set appropriate supply temperature. In addition, if an abnormality occurs in this cooling device, the temperature of the first chemical liquid 510a of the first supply pipe 510 may change unintentionally, and thus, there is a limit in that stable operation is difficult. In contrast, in an embodiment of the present disclosure, heat transfer from the second supply pipe 520 to the first supply pipe 510 is blocked by the recovery pipe 530, and therefore, an additional cooling device and temperature control device are not required. Furthermore, in the present disclosure, since the chemical liquid recovered by the recovery pipe 530 is already set to an appropriate supply temperature as the first chemical liquid 510a, the first chemical liquid 510a supplied from the first supply pipe 510 is also affected by the temperature of the first chemical liquid 510a of the recovery pipe 530, and a stable operation of maintaining an appropriate supply temperature may be provided.

On the other hand, various embodiments of the above-described recovery pipe 530 will be described as follows.

Figure 6:
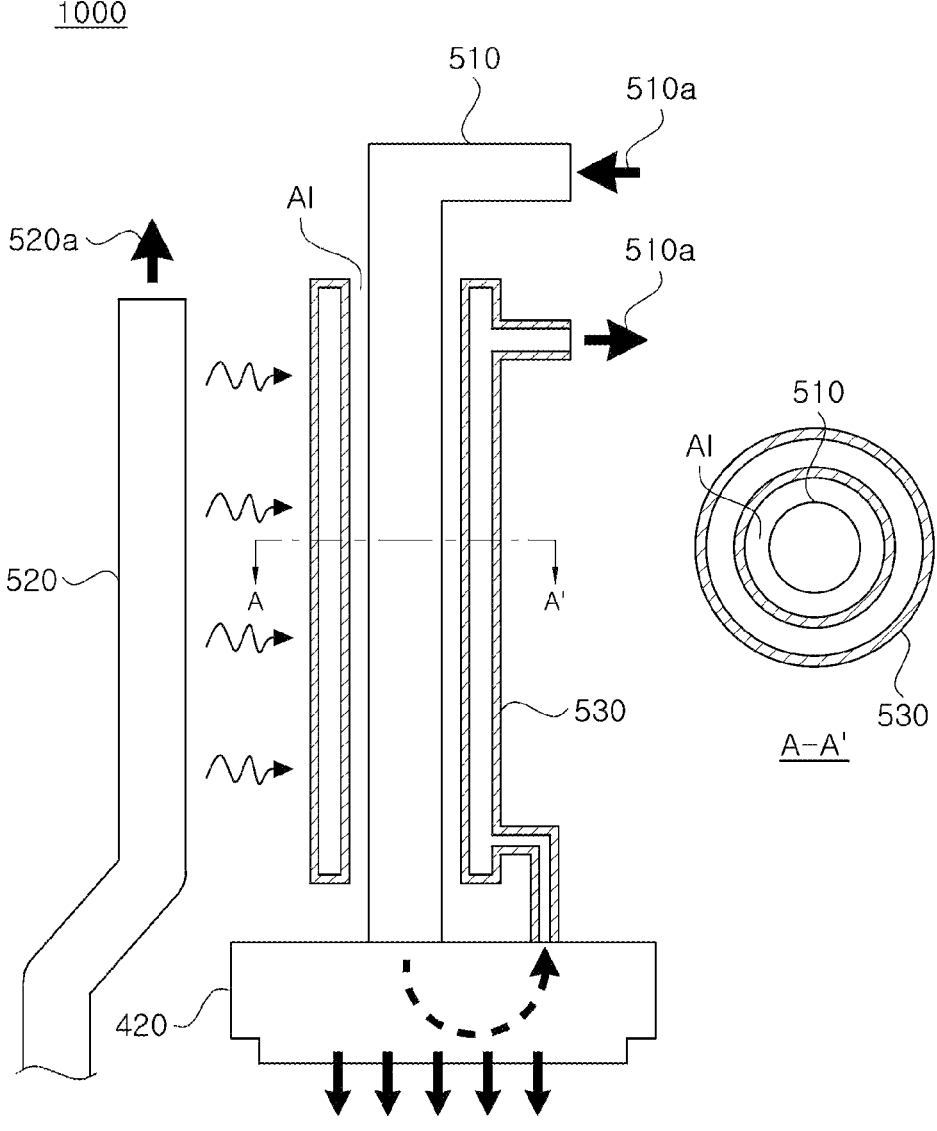
FIG. 6 is a view illustrating a substrate processing apparatus according to a first embodiment of the present disclosure.

First, as illustrated in FIG. 6 as a first embodiment, the recovery pipe 530 may be spaced apart from the first supply pipe 510 such that an air insulation layer (AI) having an air pocket structure is formed between the recovery pipe 530 and the first supply pipe 510.

For example, the air insulation layer AI may have an air pocket structure in which a space between the recovery pipe 530 and the first supply pipe 510 is filled with air. With this structure, a double insulation structure in which the recovery pipe 530 and the air insulation layer AI are disposed between the first supply pipe 510 and the second supply pipe is formed.

As such, in the case of the substrate processing apparatus 1000 according to the first embodiment, since the heat of the second supply pipe 520 transmitted in the direction of the first supply pipe 510 is double blocked by the air insulation layer (AI) together with the recovery pipe 530, the insulation performance may be improved.

Figure 7:
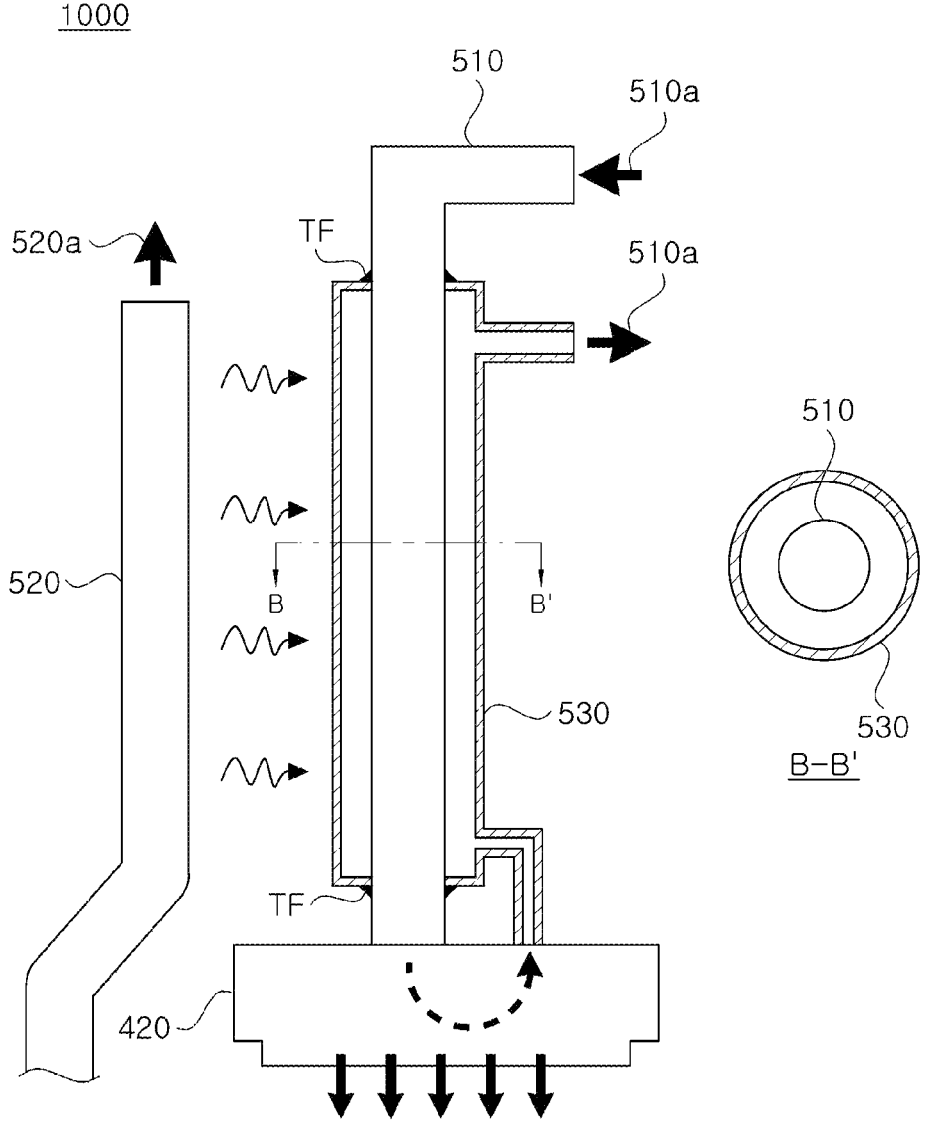
FIG. 7 is a view illustrating a substrate processing apparatus according to a second embodiment of the present disclosure.

In addition, as illustrated in FIG. 7 as a second embodiment, the recovery pipe 530 may have a structure in which the interior thereof is penetrated by the first supply pipe 510. For example, the first supply pipe 510 may have a disposition structure penetrating the interior of the recovery pipe 530.

In this case, the recovery pipe 530 is not a hollow structure, and thus has a structure with no inner thickness portion and only with an outer thickness portion. As the diameter of the entire pipe of the recovery pipe 530 may be reduced by this structure, the recovery pipe 530 may be easily installed even in a narrow installation space such as the interior of the nozzle arm.

In this manner, as the substrate processing apparatus 1000 according to the second embodiment has a structure in which the interior of the recovery pipe 530 is penetrated by the first supply pipe 510, the recovery pipe 530 may be easily installed even in a narrow installation space.

In more detail, both ends of the recovery pipe 530 through which the first supply pipe 510 passes may be heat-sealed to the first supply pipe 510. In terms of the manufacturing method, when the first supply pipe 510 is disposed to pass through the recovery pipe 530, it is difficult to install the recovery pipe 530 on the first supply pipe 510 by an assembly method such as a screw fastening method. Accordingly, both ends of the recovery pipe 530 through which the first supply pipe 510 passes are thermally fused to the first supply pipe 510, such that the recovery pipe 530 may be installed in the first supply pipe 510.

As such, the substrate processing apparatus 1000 according to the second embodiment has a structure in which both ends of the recovery pipe 530 through which the first supply pipe 510 passes are heat-sealed to the first supply pipe 510, and the recovery pipe 530 may be easily and airtightly installed in the first supply pipe 510. For reference, reference numeral TF in FIG. 7 denotes a portion where the recovery pipe 530 is thermally fused to the first supply pipe 510.

Figure 8:
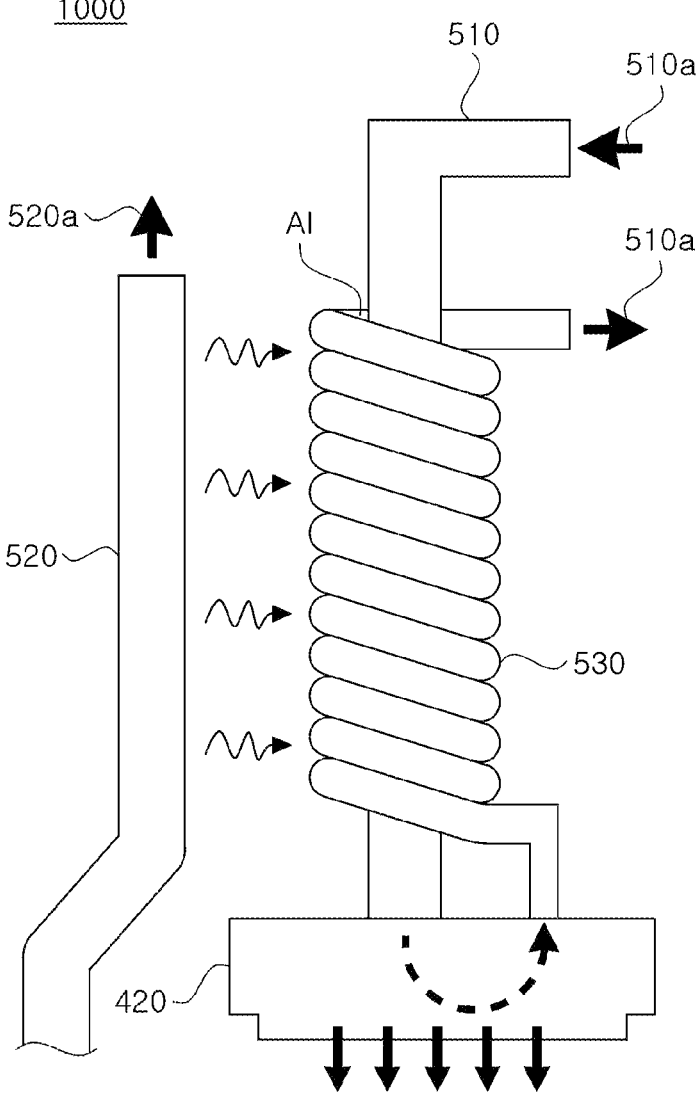
FIG. 8 is a view illustrating a substrate processing apparatus according to a third embodiment of the present disclosure.

As illustrated in FIG. 8 as a third embodiment, the recovery pipe 530 may have a structure surrounding the first supply pipe 510 in a spiral shape. For example, along the circumference of the first supply pipe 510, the recovery pipe 530 may be spirally wrapped around and extended.

At this time, the recovery pipe 530 has a structure with a considerably long length due to the spiral arrangement. As a result, the chemical liquid recovered through the interior of the recovery pipe 530 has a relatively long heat exchange time with the first supply pipe 510. In addition, the curved area inside the spiral structure recovery tube 530 allows the heat transfer area to be relatively large.

As such, the substrate processing apparatus 1000 according to the third embodiment has a structure in which the recovery pipe 530 spirally surrounds the first supply pipe 510, such that the heat exchange time becomes longer and the heat transfer area increases. The cooling efficiency of the first supply pipe 510 by the recovery pipe 530 may be increased.

As a detailed example, inclined portions 531 of the recovery pipe 530 adjacent to each other may be formed in close contact with each other. In the spiral structure of the recovery pipe 530, inclined portions surrounding the first supply pipe 510 are disposed adjacent to each other. The inclined portions 531 adjacent to each other may have a structure in close contact with each other such that there is no gap between the inclined portions 531.

As such, as the substrate processing apparatus 1000 according to the third embodiment has a structure in which the inclined portions 531 of the recovery pipe 530 adjacent to each other are formed in close contact with each other, a space between the first supply pipe 510 and the second supply pipe 520 may be reliably blocked.

As another example, the recovery pipe 530 may be spaced apart from the first supply pipe 510 such that an air pocket structured air insulation layer (AI) is formed between the spiral structure recovery pipe 530 and the first supply pipe 510.

As such, in the substrate processing apparatus 1000 according to the third embodiment, as the heat of the second supply pipe 520 transmitted in the direction of the first supply pipe 510 is double blocked by the air insulation layer (AI) together with the recovery pipe 530, insulation performance may be improved.

Figure 9:
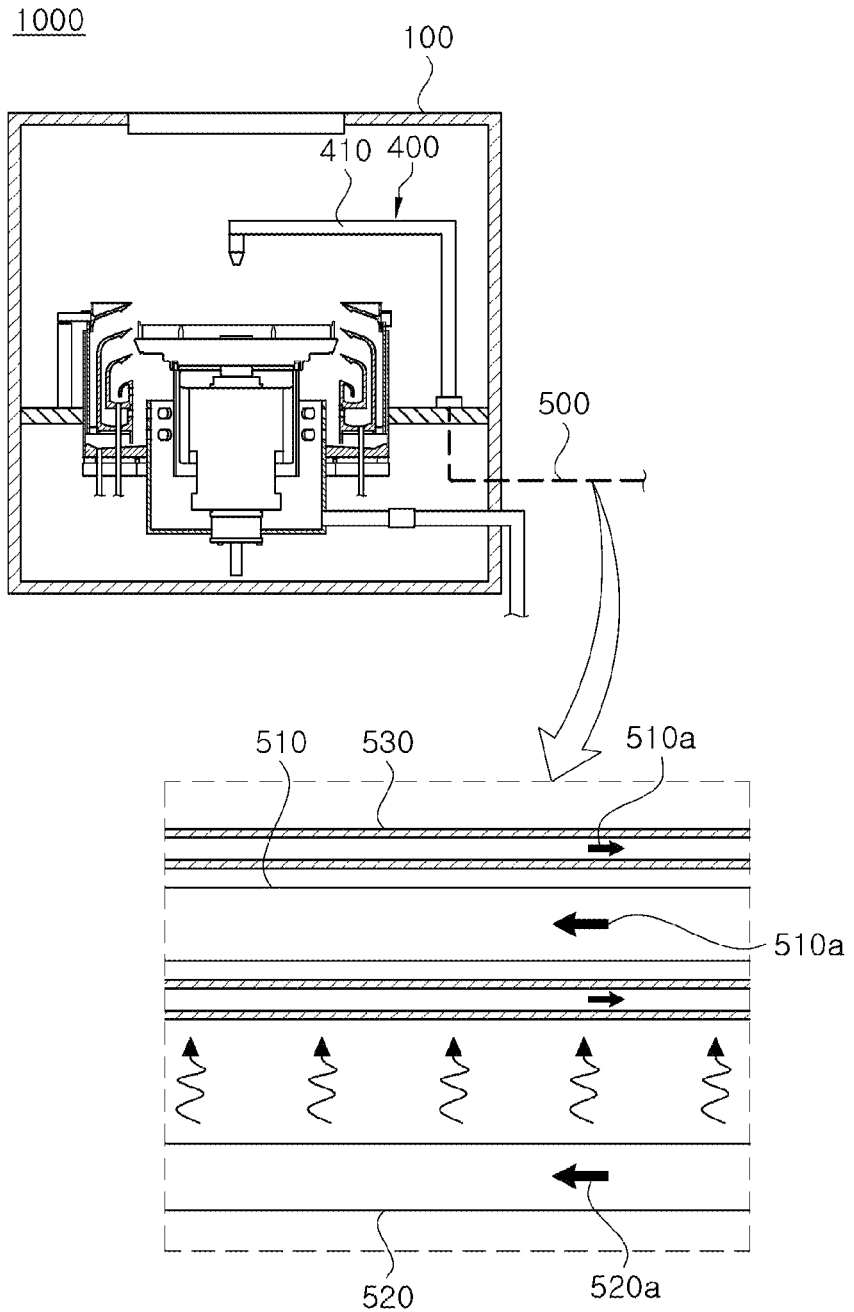
FIG. 9 is a view illustrating a substrate processing apparatus according to a fourth embodiment of the present disclosure.

On the other hand, as illustrated in FIG. 9 as a fourth embodiment, even when the first supply pipe 510 and the second supply pipe 520 are disposed outside the process chamber 100 instead of the nozzle arm 410 of the nozzle unit 400, the first supply pipe 510 may be insulated from the second supply pipe 520 by the recovery pipe 530.

As such, in the substrate processing apparatus 1000 according to a fourth embodiment, the arrangement position of the first supply pipe 510 and the second supply pipe 520 is not limited to the nozzle unit, and the first supply pipe 510 and the second supply pipe 520 may have a heat insulation structure by the recovery pipe 530 in any location except for the nozzle unit.

In detail, a liquid supply line 500 including the first supply pipe 510, the second supply pipe 520, and the recovery pipe 530 extends from the nozzle unit 400 to the outside of the process chamber 100. In this case, the recovery pipe 530 may block heat transfer from the second supply pipe 520 to the first supply pipe 510 by taking a structure surrounding the first supply pipe 510. In addition, the recovery pipe 530 not only performs a simple insulation function, but also allows the first chemical liquid 510*a* supplied from the first supply pipe 510 to be maintained at a set appropriate supply temperature.

Among the components not described in FIG. 9, components having the same reference numerals as those in FIG. 6 are the same components, and thus description thereof will be omitted.

As set forth above, according to an embodiment, a recovery pipe for recovering the chemical liquid of the first supply pipe is disposed between the first supply pipe and the second supply pipe for supplying different chemical liquids. Therefore, there is provided an effect of insulating the first supply pipe from the second supply pipe and allowing the chemical liquid supplied from the first supply pipe to maintain a set proper supply temperature.

While example embodiments have been illustrated and described above, it will be apparent to those skilled in the art that modifications and variations could be made without departing from the scope of the present disclosure as defined by the appended claims.

What is claimed is:

1. A substrate processing apparatus comprising:
   a first supply pipe supplying a first chemical liquid to a substrate;
   a second supply pipe, spaced apart from the first supply pipe, and supplying a second chemical liquid to the substrate; and
   a recovery pipe connected to the first supply pipe to collect the first chemical liquid, and disposed between the first supply pipe and the second supply pipe,
   wherein the recovery pipe has a structure surrounding the first supply pipe, and
   wherein the recovery pipe is spaced apart from the first supply pipe such that an air insulation layer of an air pocket structure is formed between the recovery pipe and the first supply pipe.

2. The substrate processing apparatus of claim 1, wherein the recovery pipe has an inside structure penetrated by the first supply pipe.

3. The substrate processing apparatus of claim 2, wherein both ends of the recovery pipe through which the first supply pipe passes are heat-sealed to the first supply pipe.

4. The substrate processing apparatus of claim 1, wherein the recovery pipe spirally surrounds the first supply pipe.

5. The substrate processing apparatus of claim 4, wherein inclined portions of the recovery pipe adjacent to each other are configured to be in close contact with each other.

6. The substrate processing apparatus of claim 4, wherein the recovery pipe is spaced apart from the first supply pipe such that an air insulation layer having an air pocket structure is formed between the recovery pipe of a spiral structure and the first supply pipe.

7. The substrate processing apparatus of claim 1, wherein the first supply pipe, the second supply pipe, and the recovery pipe are disposed outside a process chamber.

8. A substrate processing apparatus comprising:
   a nozzle unit including a nozzle arm, a main nozzle head, and a side nozzle head;
   a first supply pipe installed on the nozzle arm and supplying a first chemical liquid to the main nozzle head;
   a second supply pipe installed on the nozzle arm, spaced apart from the first supply pipe, and supplying a second chemical liquid to the side nozzle head; and
   a recovery pipe installed on the nozzle arm, connected to the first supply pipe to collect the first chemical liquid, and disposed between the first supply pipe and the second supply pipe,
   wherein the main nozzle head is installed on an end of the nozzle arm, and the first supply pipe and the recovery pipe extend from an inside the nozzle arm and are connected to the main nozzle head, the side nozzle head is installed on an end of an extension support extending from a side of the nozzle arm, and the second supply pipe extends from a inside of the nozzle arm to an outside of the nozzle arm and is connected to the side nozzle head, and the recovery pipe has a structure surrounding the first supply pipe inside the nozzle arm,
   wherein the recovery pipe is spaced apart from the first supply pipe such that an air insulation layer having an air pocket structure is provided between the recovery pipe and the first supply pipe.

9. The substrate processing apparatus of claim 8, wherein the recovery pipe has a structure in which an inside is penetrated by the first supply pipe.

10. The substrate processing apparatus of claim 8, wherein the recovery pipe spirally surrounds the first supply pipe.

11. The substrate processing apparatus of claim 10, wherein inclined portions of the recovery pipe adjacent to each other are configured to be in close contact with each other, and the recovery pipe is spaced apart from the first supply pipe such that an air insulation layer of an air pocket structure is formed between the recovery pipe of a spiral structure and the first supply pipe.

12. A substrate processing apparatus comprising:

a process chamber;

a processing container installed in the process chamber and having a processing space in which a substrate is processed;

a support unit supporting the substrate in the processing space;

a nozzle unit including a main nozzle head and a side nozzle head discharging a chemical liquid to the substrate, and a nozzle arm on which the main nozzle head and the side nozzle head are installed; and a liquid supply line extending from a liquid supply unit to an inside of the nozzle unit, wherein the liquid supply line includes, a first supply pipe installed on the nozzle arm and supplying a first chemical liquid to the main nozzle head, a second supply pipe installed on the nozzle arm, spaced apart from the first supply pipe, and supplying a second chemical liquid to the side nozzle head, and a recovery pipe installed on the nozzle arm, connected to the first supply pipe to collect the first chemical liquid, and disposed between the first supply pipe and the second supply pipe, wherein the main nozzle head is installed on an end of the nozzle arm, and the first supply pipe and the recovery pipe extend from an inside the nozzle arm and are connected to the main nozzle head, the side nozzle head is installed on an end of an extension support extending from a side of the nozzle arm, and the second supply pipe extends from the inside of the nozzle arm to an outside of the nozzle arm and is connected to the side nozzle head, and the recovery pipe has a structure surrounding the first supply pipe inside the nozzle arm, and wherein the recovery pipe is spaced apart from the first supply pipe such that an air insulation layer of an air pocket structure is formed between the recovery pipe and the first supply pipe.

13. The substrate processing apparatus of claim 12, wherein the recovery pipe has a structure in which an inside is penetrated by the first supply pipe.

14. The substrate processing apparatus of claim 12, wherein the recovery pipe spirally surrounds the first supply pipe.

\* \* \* \* \*